(12) United States Patent
Von Basse et al.

(10) Patent No.: US 6,583,632 B2
(45) Date of Patent: Jun. 24, 2003

(54) METHOD OF DETERMINING VERY SMALL CAPACITANCES

(75) Inventors: Paul-Werner Von Basse, Wolfratshausen (DE); Josef Willer, Riemerling (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/767,392

(22) Filed: Jan. 23, 2001

(65) Prior Publication Data

US 2001/0017548 A1 Aug. 30, 2001

Related U.S. Application Data

(63) Continuation of application No. PCT/DE99/01930, filed on Jul. 1, 1999.

(30) Foreign Application Priority Data

Jul. 23, 1998 (DE) .......................................... 198 33 211

(51) Int. Cl.[7] .......................... G01R 27/26; G06K 9/00
(52) U.S. Cl. ...................... 324/678; 324/662; 382/124
(58) Field of Search ................................. 324/678, 661, 324/662, 671, 677, 686; 382/124

(56) References Cited

U.S. PATENT DOCUMENTS

| | | |
|---|---|---|
| 3,781,855 A | 12/1973 | Killen |
| 4,039,940 A | 8/1977 | Butler et al. |
| 5,343,157 A | 8/1994 | Deschamps |
| 6,114,862 A * | 9/2000 | Tartagni et al. .............. 324/661 |
| 6,317,508 B1 * | 11/2001 | Kramer et al. ............... 235/439 |
| 6,346,739 B1 * | 2/2002 | Lepert et al. ................ 257/532 |

FOREIGN PATENT DOCUMENTS

| | | |
|---|---|---|
| DE | 34 13 849 C2 | 8/1985 |
| DE | 35 44 187 A1 | 6/1987 |
| DE | 39 42 159 A1 | 6/1991 |
| DE | 42 37 196 C1 | 2/1994 |
| DE | 198 33 211 C2 | 2/2000 |
| EP | 0 041 693 A1 | 12/1981 |
| EP | 0 779 497 A2 | 6/1997 |
| SE | 8 503 252-2 B | 2/1987 |
| WO | WO 00/05592 | 2/2000 |

OTHER PUBLICATIONS

Marco Tartagni et al.: "A Fingerprint Sensor Based on the Feedback Capacitive Sensing Scheme", IEEE Journal of Solid–State Circuits, No. 1, Jan. 1998, pp. 133–142, XP–000766627.

* cited by examiner

*Primary Examiner*—N. Le
*Assistant Examiner*—James Kerveros
(74) *Attorney, Agent, or Firm*—Laurence A. Greenberg; Werner H. Stemer; Ralph E. Locher

(57) ABSTRACT

A grid of capacitor surfaces is connected to read lines and control lines. The read lines are connected alternately to the output of a feedback operational amplifier and to a collecting capacitor. The capacitances to be measured are charged repeatedly and the charges are collected on the collecting capacitors. Between the charging operations, the potential on the read lines is kept constant through the use of the low-resistance output of the operational amplifier. The use of this method in the case of a fingerprint sensor makes it possible to evaluate all the read lines together.

8 Claims, 4 Drawing Sheets

METHOD OF DETERMINING VERY SMALL CAPACITANCES

CROSS-REFERENCE TO RELATED APPLICATION

This application is a continuation of copending International Application No. PCT/DE99/01930, filed Jul. 1, 1999, which designated the United States.

BACKGROUND OF THE INVENTION

Field of the Invention

The invention relates to a method of determining very small capacitances of electrical components, which can be used in particular in the case of capacitive surface sensors, in particular in the case of fingerprint sensors.

Swedish Patent Document SE 448 408 discloses a finger print sensor with capacitors which are disposed in columns and rows. The finger print sensor has read lines and control lines.

U.S. Pat. No. 5,343,157 discloses a method and apparatus for measuring an unknown capacitance using a known reference capacitance. The known reference capacitance is pumped onto the capacitor to be measured until the capacitor to be measured is charged to a given voltage.

SUMMARY OF THE INVENTION

It is accordingly an object of the invention to provide a method of measuring capacitances which is suitable for measuring very small capacitances and which is in particular suitable for an image sensing, for example of fingerprints.

With the foregoing and other objects in view there is provided, in accordance with the invention, a method of determining capacitances, the method includes the steps of:

(a) providing a grid-shaped configuration of capacitors, the capacitors being formed by pairs of electrical conductor surfaces;

(b) dividing the electrical conductor surfaces into groups;

(c) electrically conductively connecting the electrical conductor surfaces of in each case one of the groups to one another by a respective read line;

(d) electrically conductively connecting the electrical conductor surfaces of in each case one of the groups separately from one another to a respective control line;

(e) applying, during a given time, an electric potential to the respective control line such that a potential difference is present between the respective control line and a plurality of read lines and charging, with the potential difference, the capacitors formed in each case by at least one of the electrical conductor surfaces connected to the respective control line and at least one of the electrical conductor surfaces connected to one of the read lines;

(f) carrying off a charge via each of the read lines separately to a respective collecting capacitor;

(g) switching off the electric potential applied to the respective control line and impressing, at low resistance, a respective potential onto a respective one of the read lines by using a circuit, the respective potential defining a charge state of the respective collecting capacitor with respect to a reference potential;

(h) repeating steps (e) to (g) until a given number of charge operations has taken place; and (i) subsequently determining for each of the read lines one of a charge of the respective collecting capacitor and a potential difference of the respective collecting capacitor.

With the objects of the invention in view there is also provided, a method of determining capacitances, which includes the steps (a) to (g) as defined above and further includes the steps:

(h) repeating steps (e) to (g) until a potential difference which is greater than a given value is present at the respective collecting capacitor; and (i) subsequently determining for each of the read lines a number of performed charge operations.

In other words, the method according to the invention determines very small capacitances of a grid-shaped configuration of capacitors, wherein:

(a) the capacitances are formed by pairs of electrical conductor surfaces;

(b) a division of the conductor surfaces into groups is carried out;

(c) the conductor surfaces of one group each are connected in an electrically conducting manner to one another by a read line;

(d) the conductor surfaces of one group each are connected in an electrically conducting manner separately from one another to one control line each;

(e) during a predetermined time, an electric potential is applied respectively to a control line in such a way that there occurs between the control line and a plurality of read lines a potential difference which charges the capacitors which are formed by in each case at least one conductor surface connected to the control line and in each case at least one conductor surface connected to one of these read lines;

(f) the charge is carried away overreach read line separately to in each case one collecting capacitor;

(g) the potential applied to the control line is switched off and a respective potential, which defines the charge state of the collecting capacitor concerned with respect to a reference potential, is impressed at low resistance onto the read line concerned through the use of a circuit;

(h) steps (e) to (g) are repeated until a predetermined number of charges has taken place or until a potential difference which is greater than a predetermined value is present at each collecting capacitor; and (i) then the charge or potential difference of the collecting capacitor or the number of charges is determined for each read line.

According to another mode of the invention, step (g) is performed by using in each case a feedback operational amplifier; and between in each case one of the capacitors to be measured and the respective collecting capacitor, an output of the feedback operational amplifier is switched to the respective read line, at the latest at a point in time at which the electric potential applied to the respective control line is switched off.

According to yet another mode of the invention, a circuit including two p-channel MOSFETs and three n-channel MOSFETs is used as the operational amplifier, the source terminals of the p-channel MOSFETs and the drain terminal of the first n-channel MOSFET being connected to a terminal of a supply voltage, the drain terminals of the p-channel MOSFETs being connected to the drain terminals of one each of the second and third n-channel MOSFETs, the gate terminals of the p-channel MOSFETs being connected to one another and to the drain terminal of the third n-channel MOSFET, the source terminals of the second and third n-channel MOSFETs being connected to one another and via a current source to another terminal of the supply voltage, the gate terminal of the first n-channel MOSFET being connected to the drain terminal of the second n-channel MOSFET, the source terminal of the first n-channel MOSFET being connected to the gate terminal of the second n-channel MOSFET and via a further current source to the other terminal of the supply voltage and forming the output of the circuit, and the gate terminal of the third n-channel MOSFET forming the input of the circuit.

According to a further mode of the invention, a structured image surface including the grid-shaped configuration of capacitors is provided; and a capacitive image sensing is performed by using steps (a) to (i) defined above. In other words, the method according to the invention is preferably used for a capacitive image sensing with a structured conductor surface.

Other features which are considered as characteristic for the invention are set forth in the appended claims.

Although the invention is illustrated and described herein as embodied in a method for determining very small capacitances, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4c is an equivalent circuit for the measurement configuration of FIG. 4a;

FIG. 5b is an equivalent circuit for the measurement configuration of FIG. 5a;

DESCRIPTION OF THE PREFERRED EMBODIMENTS

Referring now to the figures of the drawings, the method of determining small capacitances is explained in detail. In order to better understand the invention, it is noted that in principle very small capacitances can be determined by charging the capacitance multiple times and collecting the respective charges on a greater capacitance. The magnitude of the collected charge when there have been a certain number of charging operations can be used to conclude what the value of the small capacitance is. This method can be used, for example, in the case of a capacitively measuring fingerprint sensor.

Figure 4A:
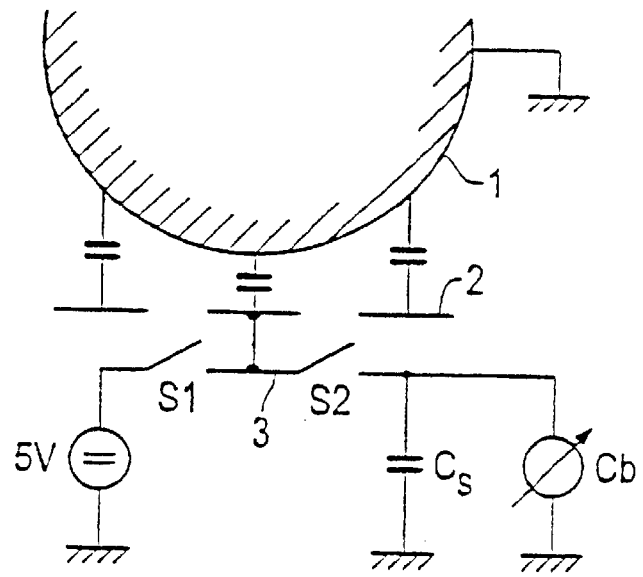
FIG. 4a is a circuit diagram of a capacitance measurement configuration.
Figure 4B:
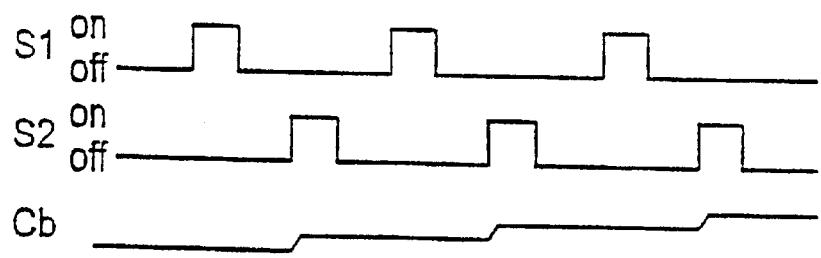
FIG. 4b a timing graph for illustrating switching operations for performing a capacitance measurement.
Figure 4C:
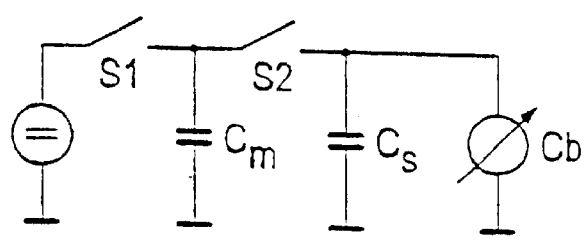

A configuration of conductors and electrical circuit components which are suitable for this purpose are represented in FIGS. 4a to 4c. For recording a complete image, for example of a fingerprint, a grid-shaped configuration of conductor surfaces is used, provided with a covering and a resting surface for the tip of a finger. Different capacitances are obtained as a result of the differing distance of the conductors from the surface of the skin, assumed to be earthed.

The capacitors which are formed by the conductors and the regions of the surface of the skin provided at a distance from them are therefore charged to different degrees when the same potential difference is applied. These charges are a measure of the capacitance with respect to the surface of the skin and can therefore serve for recording the fingerprint. To be able to measure the very small charges, they are respectively collected on a greater capacitance and measured after a number of charging operations.

Represented in cross section in FIG. 4a is the surface 1 of the image to be sensed, at a distance from the conductor surfaces 2 facing the surface of the image. This conductor surface 2 is connected to the line 3 and acts as a capacitor plate with respect to the surface 1 of the image to be sensed. It can be connected via the switches S1 and S2 alternatively to a direct voltage source, which here in the example supplies a voltage of 5 Volts, and to a capacitor $C_S$, which acts as a collecting capacitance. The charge collected on this capacitor $C_S$ is measured by the depicted Coulomb meter Cb.

In FIG. 4b, the switching signals by which the switches S1 and S2 are activated and the charges measured by the Coulomb meter are represented as a function of time.

In FIG. 4c, an electrical equivalent circuit diagram for the configuration from FIG. 4a is represented.

Instead of measuring the charge of a capacitor which is formed by conductor surfaces in two different planes, the capacitances of two conductor surfaces in the same plane may be measured. For this purpose, two conductor surfaces respectively provided as neighboring one another are preferably chosen. These conductors are coupled to one another by the resting upper side of the image, for example the surface of the skin. Here, too, the capacitive coupling becomes all the more intense, the smaller the distance between the surface of the skin and the conductor surfaces becomes. In a charge measuring device, the transmitted charge is measured.

Figure 5A:
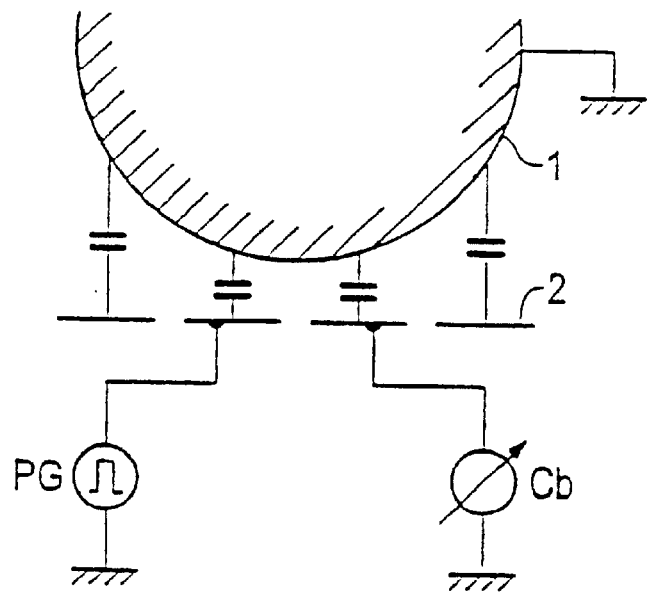
FIG. 5a is a circuit diagram of a capacitance measurement configuration.
Figure 5B:
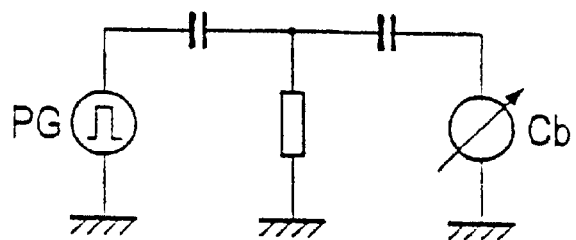

The associated sensor configuration and the electrical equivalent circuit diagram are represented in FIGS. 5a and 5b. In the case of this method, therefore the use of a single structured conductor plane, which in practice includes just an array of conductor surfaces with crossing lines, is sufficient. Since the conductors do not have to be connected to active components in direct proximity, they can be accommodated on insulating films. The charges which are obtained when this method is applied are, however, much smaller than in the case of the method described on the basis of FIG. 4.

Figure 6:
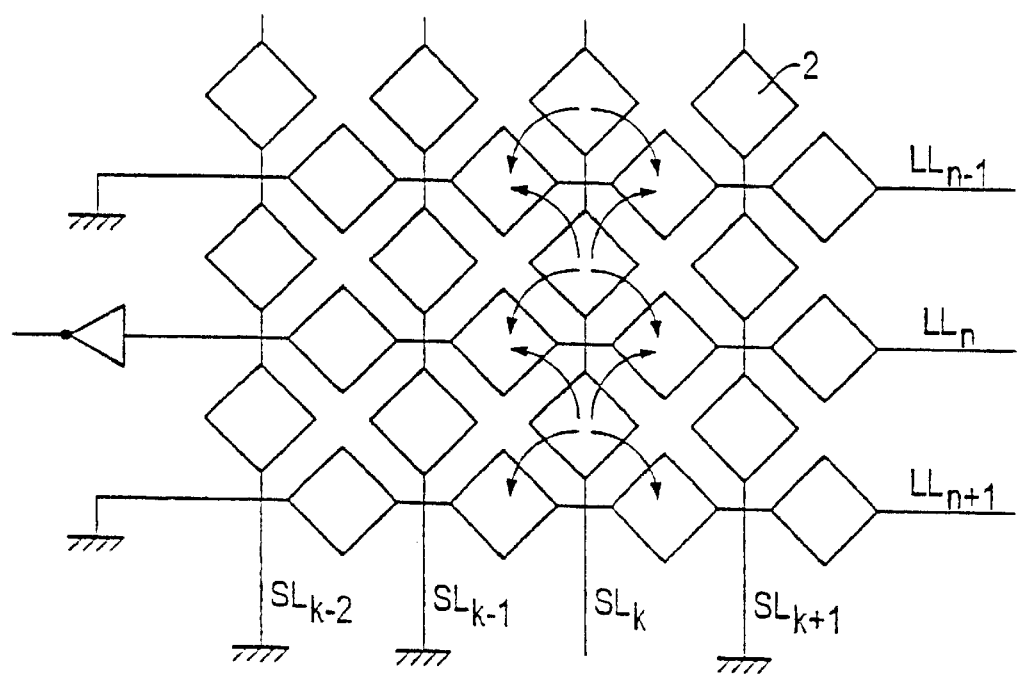
FIG. 6 is a schematic plan view of a conductor surface configuration used for capacitance measurements.

The charge measuring device preferably includes an amplifier. If an analog-digital converter is also connected downstream, to allow a digital evaluation of the measurement to be performed, this amplifier and this analog-digital converter require a considerable area, which has the result that only one image point can be selected and read out. All the other control lines and read lines must be kept at low resistance, which is shown in FIG. 6 in a schematic plan view of the conductor surface configuration. Here, the control lines or selection lines are the vertical connections of the individual square conductor surfaces. The read lines run horizontally. At the crossing points, the control lines and the read lines are insulated from one another. The capacitive couplings are indicated by the curved arrows. A similar fingerprint sensor configuration is described in the above-mentioned Swedish Patent Document SE 448 408. With this type of selection, the effect is achieved, that only one control line capacitively couples over to the lines. However, in order that the read lines do not mutually couple over to one another, all the read lines must be kept at low resistance, which can be achieved for example by switches or by the low-impedance input resistance of the amplifier.

Figure 7:
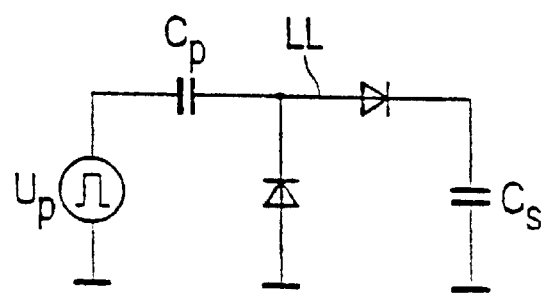
FIG. 7 is a circuit diagram of a configuration for performing a charge pumping.

Represented in FIG. 7 is a circuit with which a process of pumping charges with a serial capacitance, as also used in the case of voltage multipliers, can be carried out.

In the case of the method according to the invention, all the read lines (see lines $LL_{n-1}$, $LL_n$, $LL_{n+1}$ in FIG. 6) are read out simultaneously. The measured value from each read line is already digitized during the measuring operation. For this purpose, the pumping process is used with a serial capacitance according to FIG. 1a. In order to suppress the overcoupling from read line to read line, the two diodes are replaced by two switches and an operational amplifier. These switches S1, S2 and the operational amplifier OP are depicted in the circuit diagram of FIG. 1a.

Figure 1A:
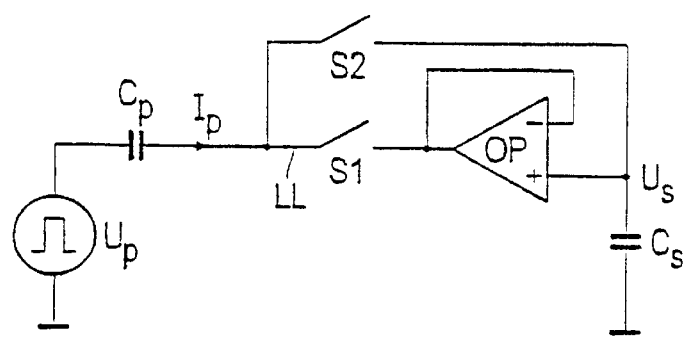
FIG. 1a is a circuit diagram of a feedback amplifier configuration according to the invention connected between a capacitance to be measured and a collecting capacitor.
Figure 1B:
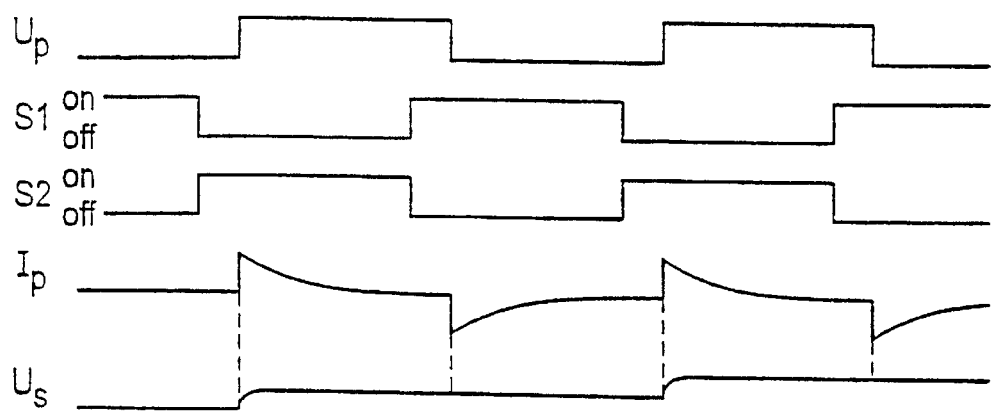
FIG. 1b is a timing graph illustrating switching operations according to the invention.

In FIG. 1b, the time sequence according to the invention of the generated voltage Up and the switching signals of the switches S1 and S2 and also the current Ip and the voltage at the capacitor $U_S$ are depicted. Shortly before the positive edge of the generator signal Up, the two switches S1, S2 are switched over. The capacitance Cp is now directly connected to the collecting capacitance $C_S$. With the positive, i.e. rising edge of the generated voltage Up, the charge is transferred from the capacitor Cp to the collecting capacitor $C_S$, the capacitance of the collecting capacitor $C_S$ being much greater than the capacitance of the capacitor Cp. The voltage $U_S$ increases by a small amount. As soon as the current Ip has decayed, the switches are again switched over. Now, the capacitance Cp is connected to the output of the operational amplifier OP. This feedback operational amplifier transfers the voltage $U_S$ at the collecting capacitor $C_S$ directly in the ratio 1:1 to its output. After the switching over of the switches, the negative, i.e. falling edge of the generated voltage Up follows. The capacitor Cp is charged again via the low-resistance output of the operational amplifier, without charge flowing away from the collecting capacitor $C_S$. Therefore, after further switching over of the switches, the discharging operation from the capacitor Cp to the collecting capacitor $C_S$ can be repeated. This sequence is referred to hereafter as the pumping cycle. During the pumping cycle, the voltage on the read line changes only slightly, so that no overcoupling from one read line to the other has to be feared. Therefore, with this method, all the read lines of an array of image points can be pumped via one control line (lines $SL_{k-2}$, $SL_{k-1}$, $SL_k$, $SL_{k+1}$ in FIG. 6) and all the read lines can be evaluated.

Figure 2:
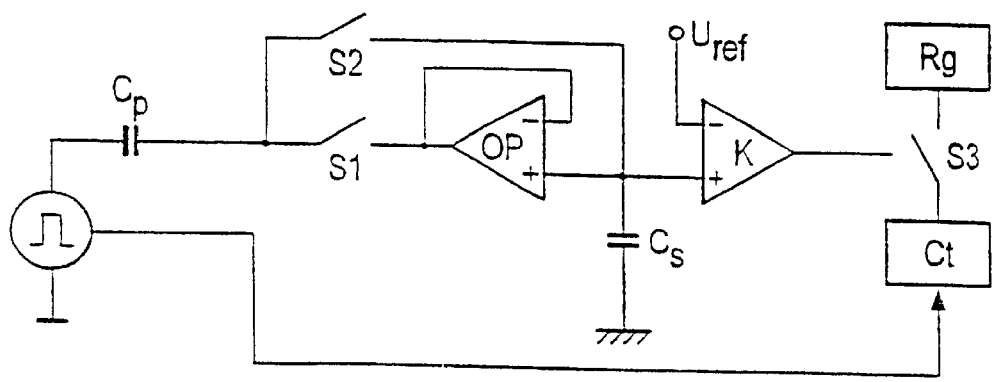
FIG. 2 is a circuit diagram of an amplifier configuration according to the invention configured for counting charging operations.

The method of the invention is preferably configured in such a way that the collecting capacitors $C_S$ are charged up to a predetermined value, the exceeding of this predetermined value is established by a comparator on the basis of a reference voltage $U_{ref}$ and the number of pumping cycles up to this value is counted by a counter. Such a configuration is represented in FIG. 2, in which a counter is denoted by Ct and a registering unit is denoted by Rg. The switch S3 serves the purpose of connecting the counter Ct alternatively to the output of the comparator K and to the input of the registering unit. In this way, the counter can be stopped when the reference voltage on the collecting capacitor is reached. The number of pumping cycles established by the counter can be stored by the registering unit after the switching over of the switch S3 and/or passed on for further evaluation.

Figure 3:
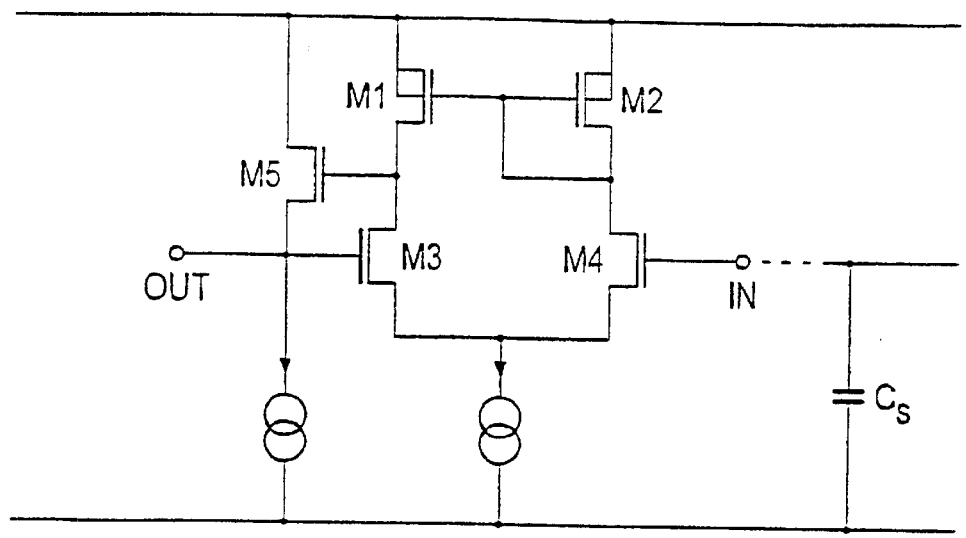
FIG. 3 is a circuit diagram of a MOSFET configuration according to the invention which is suitable for use in the ampifier configurations of FIGS. 1a and 2.

FIG. 3 shows a possible refinement of an operational amplifier suitable for the method according to the invention, as can be used in the configurations according to FIGS. 1a and 2. Other possible ways of realizing the operational amplifier are also possible, however.

It is essential for the method according to the invention that the small charges to be measured, or voltages present at the capacitors, are not directly amplified, but are converted into a digital measurement result by accumulation up to a predetermined limit. In addition, it is essential for the method that in each case a group of capacitances to be measured is measured simultaneously. This may be, for example, preferably a respective column in a matrix-shaped configuration of individual capacitors. A suitable circuit, such as that described above, can achieve the effect that a coupling or cross-coupling between the individual read lines is avoided.

The pumping process can be applied in particular to a sensor which capacitively senses an image by the coupling of two neighboring conductor surfaces. In the case of a fingerprint sensor, which is formed essentially by a structured conductor plane, the method can be used for measuring the pixel capacitance. A pixel refers to the smallest measuring area of the sensor, that is an image point. The greater the number of pixels per unit of surface area of a sensor, the better its resolution. The pixel dimension in the case of a fingerprint sensor is of the order of magnitude of 50 μm to 100 μm. The value of the pixel capacitance is inversely proportional to the distance between the surface of the skin of the finger and the conductor surface. Therefore, the number n of pumping cycles up to a certain reference value is directly proportional to the distance between the surface of the skin and the conductor surface of the sensor.

The charge excursion is $Qp = Cp \cdot \Delta Up$.

The collected charge is $Q_S = C_S \cdot U_S$, where $U_S$ is at most equal to the reference voltage $U_{ref}$.

Since, furthermore, $Q_S = n \cdot Qp$, for $U_S = U_{ref}$ there is the relationship $n = Qs/Qp$.

The capacitance Cp is inversely proportional to the distance between the surface of the skin of the finger and the conductor surface; therefore, the number of pumping cycles is proportional to this distance.

The circuit of the operational amplifier, the comparator and the collecting capacitor is so compact that it may be present once in each line of the configuration. A possible offset of the operational amplifier is compensated by the constant switching over.

We claim:

1. A method of determining capacitances, the method which comprises:
    (a) providing a grid-shaped configuration of capacitors, the capacitors being formed by pairs of electrical conductor surfaces;
    (b) dividing the electrical conductor surfaces into groups;

(c) electrically conductively connecting the electrical conductor surfaces of in each case one of the groups to one another by a respective read line;

(d) electrically conductively connecting the electrical conductor surfaces of in each case one of the groups separately from one another to a respective control line;

(e) applying, during a given time, an electric potential to the respective control line such that a potential difference is present between the respective control line and a plurality of read lines and charging, with the potential difference, the capacitors formed in each case by at least one of the electrical conductor surfaces connected to the respective control line and at least one of the electrical conductor surfaces connected to one of the read lines;

(f) carrying off a charge via each of the read lines separately to a respective collecting capacitor;

(g) switching off the electric potential applied to the respective control line and impressing, at low resistance, a respective potential onto a respective one of the read lines by using a circuit, the respective potential defining a charge state of the respective collecting capacitor with respect to a reference potential;

(h) repeating steps (e) to (g) until a given number of charge operations has taken place; and (i) subsequently determining for each of the read lines one of a charge of the respective collecting capacitor and a potential difference of the respective collecting capacitor.

2. The method according to claim 1, which comprises:

performing step (9) by using in each case a feedback operational amplifier; and switching, between in each case one of the capacitors to be measured and the respective collecting capacitor, an output of the feedback operational amplifier to the respective read line, at the latest at a point in time at which the electric potential applied to the respective control line is switched off.

3. The method according to claim 2, which comprises:

using, as the feedback operational amplifier, a circuit configuration including two p-channel MOSFETs and three n-channel MOSFETs;

connecting source terminals of the p-channel MOSFETs and a drain terminal of a first one of the n-channel MOSFETs to a terminal of a supply voltage;

connecting drain terminals of the p-channel MOSFETs to drain terminals of a second and a third one of the n-channel MOSFETs respectively;

connecting gate terminals of the p-channel MOSFETs to one another and to a drain terminal of the third one of the n-channel MOSFETs;

connecting source terminals of the second and third one of the n-channel MOSFETs to one another and via a current source to a further terminal of the supply voltage;

connecting a gate terminal of the first one of the n-channel MOSFETs to a drain terminal of the second one of the n-channel MOSFETs;

connecting a source terminal of the first one of the n-channel MOSFETs to a gate terminal of the second one of the n-channel MOSFETs and via a further current source to the further terminal of the supply voltage;

using the source terminal of the first one of the n-channel MOSFETs as an output of the circuit configuration; and using a gate terminal of the third one of the n-channel MOSFETs as an input of the circuit configuration.

4. The method according to claim 1, which comprises:

providing a structured image surface including the grid-shaped configuration of capacitors; and performing a capacitive image sensing by using steps (a) to (i).

5. A method of determining capacitances, the method which comprises:

(a) providing a grid-shaped configuration of capacitors, the capacitors being formed by pairs of electrical conductor surfaces;

(b) dividing the electrical conductor surfaces into groups;

(c) electrically conductively connecting the electrical conductor surfaces of in each case one of the groups to one another by a respective read line;

(d) electrically conductively connecting the electrical conductor surfaces of in each case one of the groups separately from one another to a respective control line;

(e) applying, during a given time, an electric potential to the respective control line such that a potential difference is present between the respective control line and a plurality of read lines and charging, with the potential difference, the capacitors formed in each case by at least one of the electrical conductor surfaces connected to the respective control line and at least one of the electrical conductor surfaces connected to one of the read lines;

(f) carrying off a charge via each of the read lines separately to a respective collecting capacitor;

(g) switching off the electric potential applied to the respective control line and impressing, at low resistance, a respective potential onto a respective one of the read lines by using a circuit, the respective potential defining a charge state of the respective collecting capacitor with respect to a reference potential;

(h) repeating steps (e) to (g) until a potential difference which is greater than a given value is present at the respective collecting capacitor; and (i) subsequently determining for each of the read lines a number of performed charge operations.

6. The method according to claim 5, which comprises:

performing step (9) by using in each case a feedback operational amplifier; and switching, between in each case one of the capacitors to he measured and the respective collecting capacitor, an output of the feedback operational amplifier to the respective read line, at the latest at a point in time at which the electric potential applied to the respective control line is switched off.

7. The method according to claim 6, which comprises:

using, as the feedback operational amplifier, a circuit configuration including two p-channel MOSFETs and three n-channel MOSFETs;

connecting source terminals of the p-channel MOSFETs and a drain terminal of a first one of the n-channel MOSFETs to a terminal of a supply voltage;

connecting drain terminals of the p-channel MOSFETs to drain terminals of a second and a third one of the n-channel MOSFETs respectively;

connecting gate terminals of the p-channel MOSFETs to one another and to a drain terminal of the third one of the n-channel MOSFETs;

connecting source terminals of the second and third one of the n-channel MOSFETs to one another and via a current source to a further terminal of the supply voltage;

connecting a gate terminal of the first one of the n-channel MOSFETs to a drain terminal of the second one of the n-channel MOSFETs;

connecting a source terminal of the first one of the n-channel MOSFETs to a gate terminal of the second one of the n-channel MOSFETs and via a further current source to the further terminal of the supply voltage;

using the source terminal of the first one of the n-channel MOSFETs as an output of the circuit configuration; and using a gate terminal of the third one of the n-channel MOSFETs as an input of the circuit configuration.

8. The method according to claim 5, which comprises:

providing a structured image surface including the grid-shaped configuration of capacitors; and performing a capacitive image sensing by using steps (a) to (i).

* * * * *